(12) United States Patent
Wan et al.

(10) Patent No.: US 6,984,978 B2
(45) Date of Patent: Jan. 10, 2006

(54) MAGNETIC FIELD SENSOR

(75) Inventors: Hong Wan, Maple Grove, MN (US); Jay R. Goetz, Deephavon, MN (US)

(73) Assignee: Honeywell International Inc., Morristown, NJ (US)

( * ) Notice: Subject to any disclaimer, the term of this patent is extended or adjusted under 35 U.S.C. 154(b) by 338 days.

(21) Appl. No.: 10/073,542

(22) Filed: Feb. 11, 2002

(65) Prior Publication Data

US 2003/0151406 A1 Aug. 14, 2003

(51) Int. Cl.
*G01R 33/02* (2006.01)

(52) U.S. Cl. ..................... 324/252; 324/244

(58) Field of Classification Search ..............................
324/207.11–207.19, 207.2, 207.21, 207.24,
324/207.25, 245, 251, 252, 260–261
See application file for complete search history.

(56) References Cited

U.S. PATENT DOCUMENTS 5,825,595 A 10/1998 Gill
5,945,825 A 8/1999 Clemens
6,020,738 A 2/2000 Van Den Berg et al.
6,329,818 B1 12/2001 Tokunaga et al.
2003/0057938 A1 * 3/2003 Goetz ..................... 324/117 R

FOREIGN PATENT DOCUMENTS

DE 197 43 335 C 11/1998
DE 197 55 673 A 7/1999
WO WO 89/10570 A 11/1989

* cited by examiner

*Primary Examiner*—Bot LeDynh
(74) *Attorney, Agent, or Firm*—Matthew Luxton

(57) ABSTRACT

An integrated magnetic field sensing device includes at least two magnetoresistive elements which are biased in a first direction by an integral conductor and are sensitive to magnetic field components in a direction perpendicular to the first direction. The sensitivity of the device to a magnetic field is adjustable and is related to the level of the bias current. In a current measuring application, two of the magnetic field sensing devices are mounted on opposite sides of and perpendicular to a conductor carrying a current to be measured. In a portable current measuring apparatus, two of the magnetic field sensors are mounted in a housing that assists in locating the magnetic field sensors relative to the conductor carrying the current to be measured.

16 Claims, 3 Drawing Sheets

MAGNETIC FIELD SENSOR

BACKGROUND OF THE INVENTION

The invention relates in general to magnetic field sensors and more particularly to integrated magnetic field sensors formed on a single semiconductor die and requiring the use of a magnetic field for functions such as domain setting, calibration, establishing a bias or offset magnetic field, providing a feedback field, determining a sensor transfer characteristic, or other functions requiring a magnetic field.

Extremely small magnetic field sensing devices can be made using strips of a magnetoresistive film of a material such as Permalloy™. The magnetization of the film forms an angle with current flowing in the film and the resistance of the film varies with this angle. When the magnetization of the film is parallel to the current, the resistance is at a maximum, and when it is perpendicular to the current, the resistance has a minimum value.

Magnetic field sensing devices may be used in many applications including, but not limited to, magnetic signal or power isolation, solid state compassing, e.g., in automobiles; current measuring devices; signature detection, e.g., metal detection; and anomaly detection, e.g., position sensing.

Solid state compassing may be used in personal items, for example, in a watch. Position sensing may be used to sense the position of a medical device, such as a catheter within the body of a patient. These and other applications have created requirements for magnetic sensing devices that are of a smaller size and that require less power than the devices of the past.

The present invention also relates to magnetic field sensing devices and to their use in electrical current sensing and measurement applications. Various magnetic field sensing techniques have been used for the measurement of current. Current sensing can be accomplished using Hall Effect transducers. In one arrangement, an electromagnet having a coil that carries the current to be measured produces a magnetic field. A Hall device is used to sense the magnetic field which is proportional to the current. A pole piece may be used to concentrate the magnetic field where the Hall device is located. The Hall device may be designed to provide an analog output or a digital output. In another arrangement, the current to be measured is passed through a coil on a soft iron core having an air gap. A Hall device is placed in the air gap to the sense the magnetic field generated by the current. This technique can be refined by placing a second compensating coil carrying and adjustable and known current on the iron core that opposes the magnetic field created by the current to be measured. The Hall device then senses a condition when the field from the coil carrying the measured current has been nulled by the field from the compensating coil. The number of turns in each of the coils is used to relate the known current to the current to be measured. One disadvantage of the methods just described is that they require that the current measuring arrangement be inserted into the circuit carrying the current to be measured.

Non-contact clamp-on current measuring devices provide a convenient means for measuring DC and AC line current in a current carrying conductor without the need to interrupt the circuit to insert the measuring device. Present methods of non-contact current measurements in conductors often consist of the use of iron or other ferrous types of magnetic materials configured so as to surround or nearly surround a current carrying conductor in a transformer-like configuration. These present methods, sometimes referred to as a "current clamp" or "clamp-on current probe" are widely employed in measuring a.c. currents in wires and other electrical conductors. These devices provide a means of rapidly measuring the AC current by surrounding the conductor with a closed or nearly closed magnetic circuit which is configured as a transformer which is designed for a convenient ratio for measurement to provide, for example, one milliampere per ampere, or one millivolt per ampere. The output of these clamp-on current probes is then read out on a meter or attached via wires to a multimeter. Electronic displays may also be used to display current values. The use of magnetic materials and the need for these materials to surround the current carrying conductor has some disadvantages.

A second common non-contact method of measuring current utilizes the Hall Effect. A Hall element placed in the region of a magnetic field provides an output voltage proportional to the field. One known current transducer uses a Hall-effect device arranged in a gap of a toroidal core. The conductor carrying the current to be monitored is arranged to pass through the toroid. The Hall-effect element measures directly the flux resulting from the introduction of MMF in the toroidal core due to the current in the conductor. Hall element devices are often utilized for both AC and DC non-contact current measurements in wires and other conductors and are available from manufacturers and distributors of AC clamp-on current probes.

Certain current measuring devices that utilize magnetoresistive sensors and require electrical connection into the circuit being measured are also known. For example, in one arrangement a sensor is mounted on one side of a circuit board with permanent magnets mounted on the same side of the circuit board and near opposite edges of the sensor to provide a magnetic field for initial magnetic alignment and biasing of the sensor. A coil which carries the current to be measured is mounted on the other side of the circuit board and opposite the sensor. For low current measuring applications, the coil may be many turns of wire and for high current measuring applications, the coil may consist of a U-shaped heavy conductor with electrical connections made at the ends of the U. In this arrangement, the sensitivity of the current sensor depends on the magnet strength and location. The matching characteristics of the magnets have a great effect on the accuracy and linearity of the current sensor. The inability to attach magnets, for example by gluing, to achieve the same spacing and alignment in devices of this type will also affect the accuracy and linearity of the sensor. Thus, a need exists for a current measuring apparatus that does not require the use of ferrous materials to surround the conductor in which current is being measured or the use of ferrous materials to increase the flux density, and further provides wide flexibility in current measuring ranges.

SUMMARY

The present invention solves these and other needs by providing in a first aspect an integrated magnetic field sensing device including at least two magnetoresistive elements which are biased in a first direction by an integral conductor and are sensitive to magnetic field components in a direction perpendicular to the first direction. The sensitivity of the device to a magnetic field is adjustable and is related to the level of the bias current.

In a second aspect, two of the magnetic field sensing devices are mounted in a housing and, in use, the two magnetic field sensing devices are located on either side of and perpendicular to a conductor carrying a current which is to be measured.

DESCRIPTION OF THE PREFERRED EMBODIMENT

Figure 1:
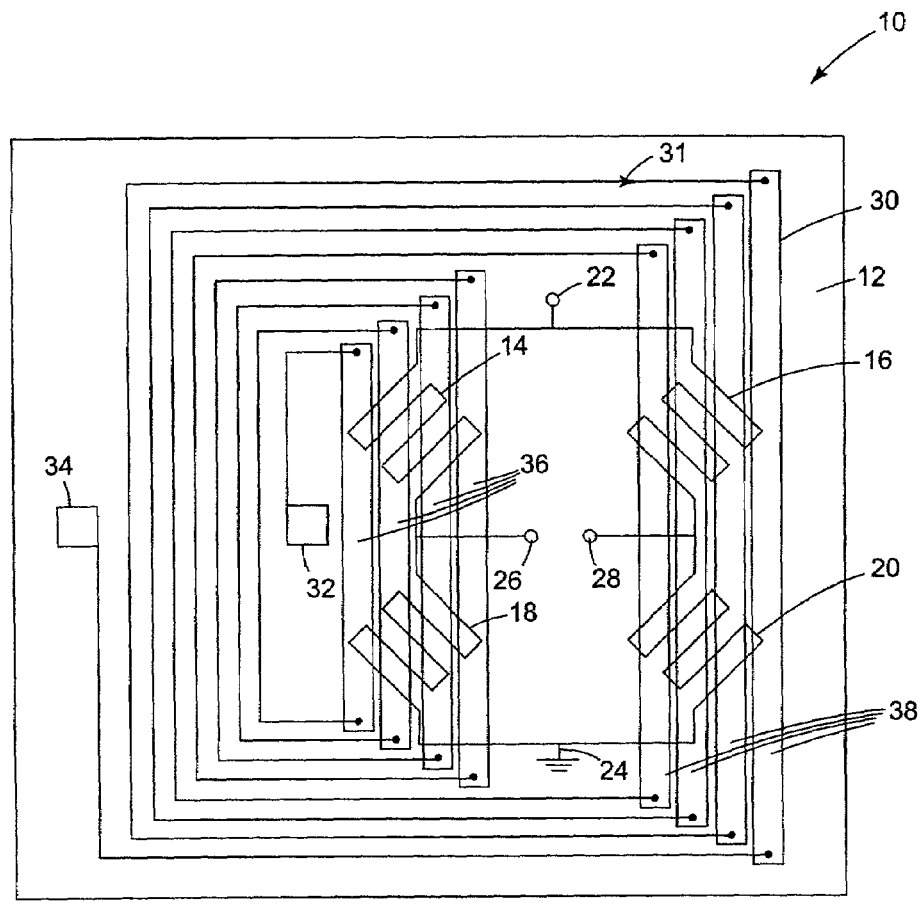
FIG. 1 shows a top plan view of a magnetic field sensing device according to the teachings of the present invention.

A device for sensing magnetic fields in accordance with the principles of the present invention is shown in the drawings and generally designated 10. FIG. 1 shows and integrated circuit layout for a magnetic field sensor in accordance with the present invention. Magnetic field sensor 10 is formed on a semiconductor substrate 12 using integrated circuit techniques. Four magnetoresistive elements 14 16, 18, and 20 are interconnected into a Wheatstone bridge configuration as shown with opposing magnetoresistive elements 14 and 20 oriented for current flow in the same direction and opposing magnetoresistive elements 16 and 18 oriented for current flow in the same direction. A voltage may be applied between 22 and 24 and an output of the bridge may be taken at 26 and 28.

A bias field conductor or coil or current strap 30 is connected between pad 32 and pad 34. Conductor 30 is in a spiral form that extends in a clockwise direction from pad 32 to pad 34. Conductor 30 includes segments 36 which pass above magnetoresistive elements 14 and 18, and segment 38 which pass above magnetoresistive elements 16 and 20. A voltage may be applied between pad 32 and pad 34 to provide current 31 in conductor 30. The current in segments 36 of conductor 30 will create a magnetic field or bias field from left to right in elements 14 and 18. The current in segments 38 will create a bias field from left to right in elements 16 and 20.

Figure 2A:
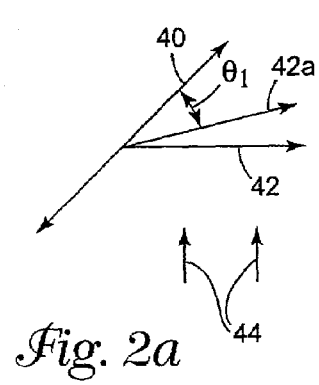
FIGS. 2a and 2b are diagrammatic representations of the angle between the directions of magnetization and the current flow in two legs of a Wheatstone bridge.

In use, device 10 will be sensitive to magnetic field components in a direction perpendicular to a bias field or direction of initial magnetization. With reference to FIG. 2a, the direction of current in element 14 is shown as 40. In the absence of magnetic field components in a direction perpendicular to bias field 42, there will be an angle of approximately 45 degrees between current direction 40 and bias field direction 42. When magnetic field components 44 in a direction perpendicular to bias field 42 are present, the direction of magnetization is rotated to a direction 42a and an angle $\theta_1$ is formed between direction of current 40 and direction of magnetization 42a.

Figure 2B:
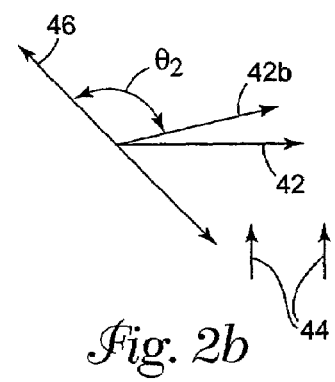

With reference to FIG. 2b, the direction of current in element 16 is shown as 46. In the absence of magnetic field components in a direction perpendicular to bias field 42, there will be an angle of approximately 135 degrees between current direction 46 and bias field direction 42. When magnetic field components 44 in a direction perpendicular to bias field are present, the direction of magnetization is rotated to a direction 42b and an angle $\theta_2$ is formed between direction of current 46 and direction of magnetization 42b.

When bias field 42 is of sufficient strength, the magnetization of magnetoresistive elements 14, 16, 18, and 20 aligns in the same direction as the bias field. When applied field magnetic components 44 are present, the amount of rotation of magnetization 42 in element 14 to direction 42a in FIG. 2a and the amount of rotation of magnetization 42 in element 16 to direction 42b in FIG. 2b depends not only on the strength of magnetic components 44, but also on the strength of bias field 42.

The strength of bias field 42 above the level needed to initially align magnetization does effect the sensitivity of device 10 in that with a lower bias field, the sensitivity will be higher, i.e., the field range will be lower than it would be for a higher bias field. Thus, according to the principles of the present invention, the strength of bias field 42 may be operated at various levels in order to adjust the sensitivity or field range of device 10.

Figure 3:
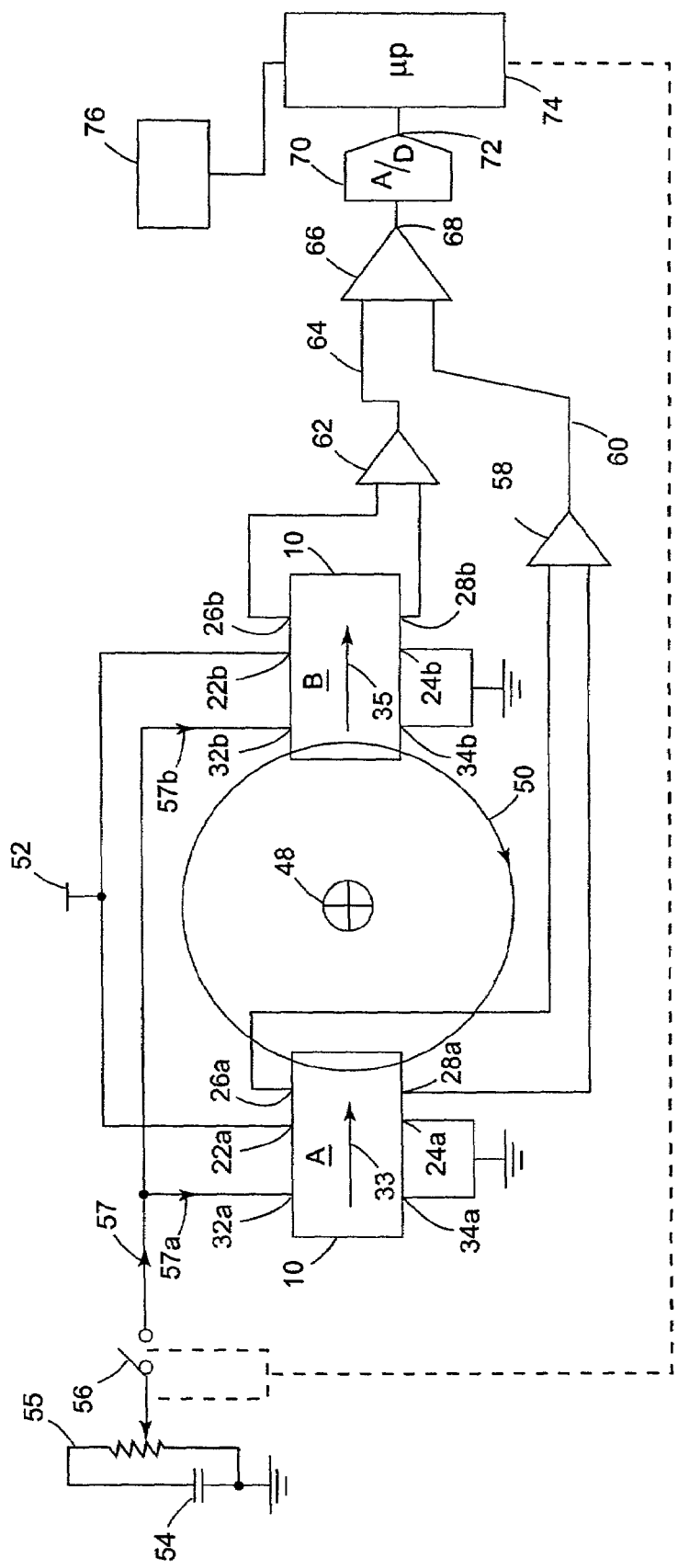
FIG. 3 is a schematic representation of a current measuring apparatus according to the principles of the present invention.

Magnetic field sensing devices are used in a variety of applications, including current measuring applications. For example, a conductor that carries the current to be measured may be located so that the current to be measured provides magnetic field components in the direction of magnetic field components 44. The conductor could be formed as an integral part of device 10 or could be separate from device 10. The conductor could be formed into a coil. Another example of a current measuring circuit using magnetic field sensing devices is shown in FIG. 3 which includes a current carrying conductor 48 with current flowing into the page and creating a magnetic field as illustrated by circle 50. Additional concentric circles that would further represent the magnetic field are not shown for the sake of simplicity. The circuit of FIG. 1 is assumed to be formed on a semiconductor and packaged as shown in sensor A and sensor B. Sensor A includes pins 32a and 34a which provide connections to 32 and 34, pins 22a and 24a which provide connections to 22 and 24, and connections 26a and 28a which provide connections to 26 and 28. Sensor B includes pins 32b and 34b which provide connections to 32 and 34, pins 22b and 24b which provide connections to 22 and 24, and connections 26b and 28b which provide connections to 26 and 28. A voltage supply at 52 is connected to pin 22a of sensor A and pin 22b of sensor B. Pin 24a of sensor A and pin 24b of sensor B are connected to ground. Current to the conductor, or coil or strap 30 is provided from voltage 54 thru voltage divider 55 and thru switch 56 which is connected to pin 32a of sensor A and pin 32b of sensor B. The function of voltage 54 and voltage divider 55 could of course be implemented in microprocessor 74 or by other means. The direction of a bias field provided by current 57a in coil 30 of sensor A is shown by arrow 33 and a direction of a bias field provided by current 57b in coil 30 of sensor B is shown by arrow 35. An output of sensor A is available at pin 26a and pin 28a which are an input to amplifier 58 which has an output 60 The output of sensor B is available at pin 26b and pin 28b which are an input to amplifier 62 which has an output 64. Output 60 and output 64 are the input to amplifier 66 which has an output 68. For a magnetic field 50 of a certain value for a given current in conductor 48, output 26a, 28a of sensor A will have a certain polarity and output 26b, 28b of sensor B will have an opposite polarity. The output of sensor A and the output of sensor B are connected so as to be subtractive with the result being a signal of double the magnitude of sensor A or sensor B. Output 68 of amplifier 66 is input to analog to digital converter or A/D 70 and digital output 72 of A/D 70 is an input to microprocessor 74. Voltage divider 55 and switch 56 are controlled by microprocessor 74. Microprocessor 74 is preferably a lower-power and lower performance processor such as a PIC12C58 which is suitably programmed to use an algorithm to periodically receive digital signal 72 and provide a signal or count on display 76 indicative of the current in conductor 48. The magnetic field intensity $H_A$ at sensor A is then given by the equation $$H_A = H_S + \frac{2\pi I}{10R}$$

where $H_S$ is the stray magnetic field in Oersteds (Oe);
I is the current in conductor 48 in Amperes;
and R is the distance from the center of conductor 48 to sensor A in centimeters.

Similarly, the magnetic field intensity at sensor B is given by $$H_B = H_S - \frac{2\pi I}{10R}$$

Assuming a bridge supply voltage 52 of $V_{CC}$, the voltage output, $V_{AO}$ at 26a, 28a of sensor A is given by $$V_{AO} = V_{CC} S_A H_A + V_{OA}$$

where $S_A$ is the sensitivity of sensor A in mV/V/Oe;
and $V_{OA}$ is the offset of sensor A in volts.

Voltage output, $V_{BO}$ at 26b, 28b of sensor B is given by $$V_{BO} = V_{CC} S_B H_B + V_{OB}$$

Where $S_B$ is the sensitivity of sensor B in mV/V/Oe and $V_{OB}$ is the offset of sensor B in volts.

Sensitivity, S is given by the expression $$S = 0.9 \frac{\Delta R}{R} \frac{1}{H_{bias} + Hs}$$
$$= OR \frac{\Delta R}{R} \frac{1}{CI_{bias} + Hs}$$

where $$\frac{\Delta R}{R}$$

is determined by the Permalloy film and a value of about 0.03 is typical;
$H_{bias}$ is the magnetic field intensity induced by the bias current.
$H_{bias} = CI_{bias}$
C=coil constant which is determined by coil design with a typical value being about 0.02 Oe/mA.
$H_S$ is the anisotropy field of the Permalloy element determined by the material and element shape with a typical value being in the range of 5–10 Oe.

Assuming $S_A = S_B$, then output 68 of amplifier 66 or $$V_{system\ output} = M(V_{AO} - V_{BO})$$

$$= M\left(V_{CC} S \frac{4\pi I}{10R} + V_{OA} - V_{OB}\right)$$

where M is an amplification factor related to the amplification of amplifiers 58, 62, and 66.

According to the principles of the present invention, the sensitivity of sensor A and sensor B may be varied by adjustment of current 57 with increasing current reducing the sensitivity.

Now that the basic operation of the current measuring circuit of FIG. 3 has been explained, many variations can be set forth and appreciated.

Figure 4:
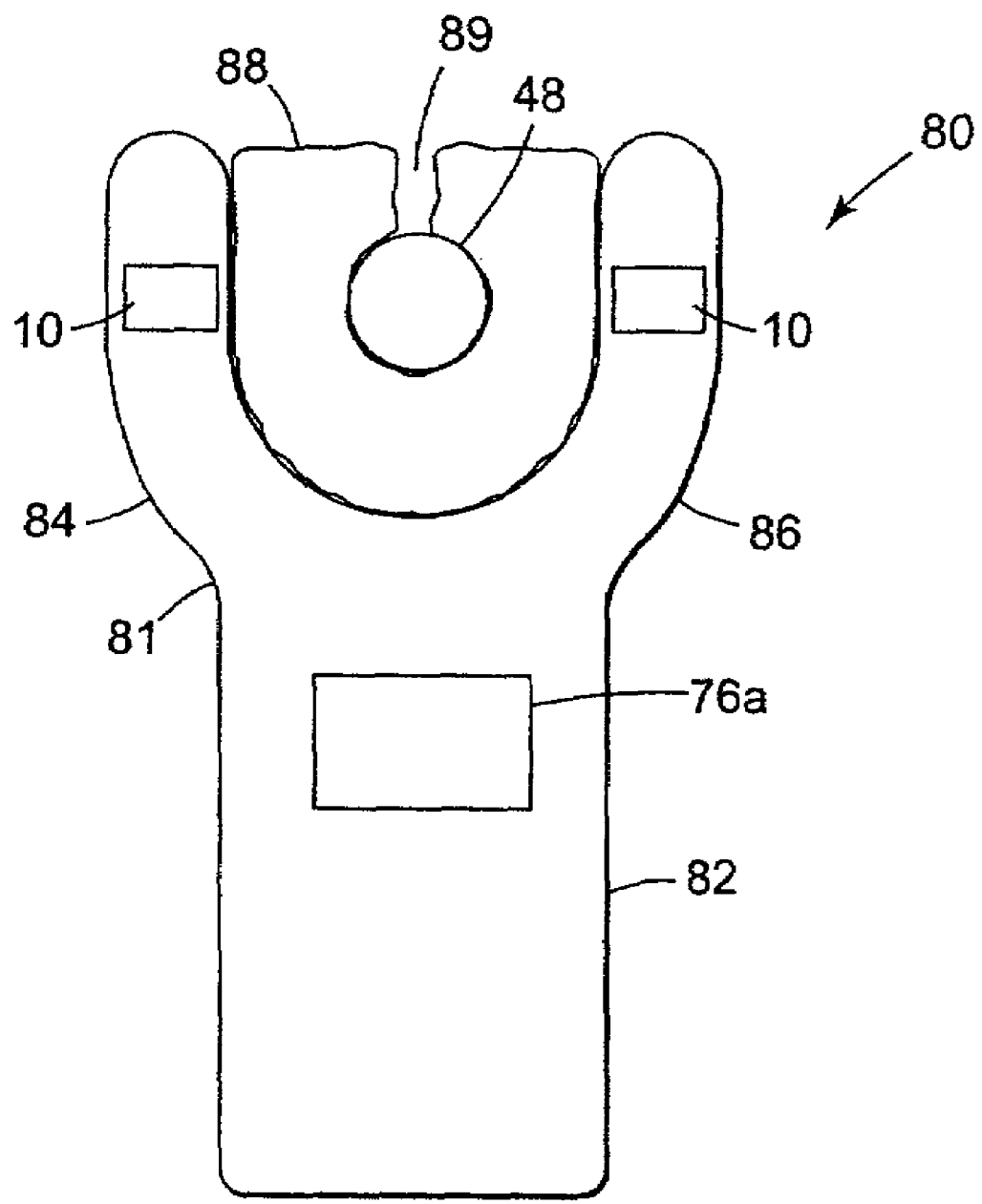
FIG. 4 is a plan view of a current measuring apparatus according to the schematic of FIG. 3.

The circuit of FIG. 3 may be utilized to meet various needs. For example, sensor A and sensor B may be at fixed locations on a printed wiring board (PWB) with conductor 48 located between sensor A and sensor B. Sensor A and Sensor B could be mounted perpendicular to the PWB or mounted parallel to the PWB. Conductor 48 could be parallel to the PWB or could pass through the PWB. FIG. 3 illustrates sensor A and sensor B located perpendicular to and on either side of conductor 48 and also aligned with conductor 48. In this configuration, sensor A and sensor B are only sensitive to magnetic field components in the vertical or y-direction. However, other locations could be used. For example, sensor A and sensor B could be located below conductor 48 in which case the sensed y-component would be reduced and this reduction would need to be considered in the calculation of current by resolving the vertical (y-component) and horizontal (x-component) by well known means. To achieve the best accuracy and for simplicity of calculation, it is important that the plane of sensor A and the plane of sensor B be maintained in a perpendicular relationship with the conductor carrying the current to be measured, that they be located an equal distances from the conductor, and that they be located on a line that extends through the conductor. A current measuring apparatus 80, which incorporates the circuit of FIG. 3 into a structure, is shown in FIG. 4. Apparatus 80 is formed of nonconductive molded material and includes a housing having a lower portion 82, a first leg 84, and a second leg 86 which form a C-shaped clamp extending on opposite sides of conductor 48 which is carrying a current to be measured. Apparatus 80 provides for mounting two magnetic field sensing devices 10 so that they are in a controlled spaced relationship that allows them to be located on opposite sides of current carrying conductor 48. Material 88 occupies the space between and is secured, for example by gluing, to the inside surface of leg 84 and the inside surface of leg 86. Material 88 is non-magnetic resilient spongy like material that offers resistance when apparatus 80 is positioned so that a conductor is centered between leg 84 and leg 86. Material 88 may be metallic, for example brass, so long as it is not magnetic. Material 88 needs to be deformable but offer sufficient resistance so that a conductor 48 will be properly centered between leg 84 and leg 86, preferably for a range of sizes of conductor 48. Material 88 is intended to accommodate a conductor 48 of various sizes and may, depending on the nature of the material, include a slit 89 to assist in centering conductor 48.

Microprocessor 74, associated circuitry and display 76 may be housed in lower portion 82 of apparatus 80 which may be used as a way of holding apparatus 80.

In the circuit of FIG. 3, output 68 of amplifier 66 is representative of a difference in the output of sensor A and sensor B. When connected in this way, the effect of an unwanted or stray field such as the earth's magnetic field will be removed since both sensor A and sensor B will sense the earth's magnetic field. In some applications, it may be desirable to connect sensor A and sensor B differently.

Microprocessor 74 can be suitably programmed to duty cycle the current to bias conductor or strap 30. Duty cycling provides the benefit that less power is dissipated in device 10. Considerations include that a 5 milliamp (am) per gauss strap requires 250 mA to provide 50 gauss of field strength. The reaction of the magnetoresistive effect is very fast. The bandwidth is typically in the 1 to 5 MHz range. The circuit of FIG. 3 may be used to measure a broad range of currents, for example from the milliamp range to 1000 amps.

In addition, microprocessor 74 may be suitably programmed to modulate the current in strap 30 for transmission purposes. In this application, a high frequency AC signal imposed on strap 30 will cause the output to generate "sum and difference" signals which can be used in wireless transmission of sensor data, i.e., similar to AM radio modulation. Since these sensors have high bandwidth, signals in the 5 to 10 MHZ range should be achievable. Modulating the strap would allow the system to avoid DC offsets and low frequency noise, by moving the signal to a higher frequency. Demodulation can be done by detecting the "envelope" of the signal, e.g., 50/60 Hz in the case of commercial power line current measurement.

Device 10 has been described using an illustration of a meander or herringbone type of magnetoresistive elements which may provide advantages. For example, the processing of herringbone type sensors is simpler tan that required for certain other types of magnetic field sensors. In addition, the inherent impedance of herringbone sensors is higher which will be an advantage in some applications. An example of a magnetic field sensor that includes such herringbone elements, but does not include other elements of the present invention is the HMC1501 as manufactured by Honeywell International. However, the principles of the present invention also apply to magnetoresistive elements of other types. For example, the invention applies to magnetoresistive elements which are formed of elongated strips of Permalloy having a pattern of metal overlaid on the strips to form shorting bars. This technique is referred to as "barber pole biasing."

While device 10 has been described in terms of a four-leg Wheatstone bridge arrangement, it is to be understood that two element bridges utilizing a single current source or utilizing two current sources may be used as well as other alternative arrangements Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than the foregoing description, and all changes, which come within the meaning and range of equivalency of the claims, are intended to be embraced therein.

What is claimed is:

1. Apparatus for sensing a magnetic fields due to a current to be measured comprising:

a first device comprising planar magnetic field sensing means having at least a first magnetic field sensing element, a second magnetic field sensing element, and an output terminating region;

a second device comprising planar magnetic field sensing means having at least a first magnetic field sensing element, a second magnetic field sensing element, and an output terminating region;

means for supporting said first device on a side of a conductor carrying a current to be measured and for supporting said second device on an opposite side of said conductor, with said first device and said second device lying in a common plane perpendicular to said conductor;

bias current means for providing a bias field for setting a direction of magnetization in said first magnetic field sensing elements and in said second magnetic field sensing elements in a first direction with said bias field being sufficient to initially align magnetization in said first magnetic field sensing elements and said second magnetic field sensing elements; and, means for determining a combination of an output of said first device and an output of said second device with said combination representing said current to be measured and said device having a level of sensitivity related to a level of said bias current.

2. The apparatus of claim 1 wherein said planar magnetic field sensing means comprises four magnetoresistive elements forming four legs of a Wheatstone bridge with opposite legs of said Wheatstone bridge having current flow in the same direction.

3. The apparatus of claim 1 wherein said magnetic field sensing elements comprise elongated strips having a pattern of metal overlaid on said strips to alter the direction of current flow through said strips.

4. The apparatus of claim 1 wherein said bias current means comprises a conductor in the form of a coil comprising at least one turn.

5. The apparatus of claim 1 further comprising means for varying a level of said bias current.

6. The apparatus of claim 1 wherein said output of said first device and said output of said second device are connected to provide an output representing a difference between said output of said first device and said output of said second device.

7. The apparatus of claim 1 wherein said means for supporting said first device on a first side of a conductor carrying a current to be measured and for supporting said second device on an opposite side of said conductor comprises a housing having a first leg supporting said first device and a second leg supporting said second device.

8. The apparatus of claim 7 further comprising a non-magnetic deformable resilient material for maintaining said first device and said second device equally spaced from said conductor carrying a current to be measured.

9. The apparatus of claim 8 wherein said material is located between said first leg and said second leg and offers sufficient resistance to deformation to keep said first device and said second device equally spaced from said conductor carrying a current to be measured.

10. Apparatus for sensing a magnetic fields due to a current to be measured comprising:

a first magnetic field sensing means and a second magnetic field sensing means with each of said first and second means having first, second, third, and fourth magnetoresistive elements and an output terminating region, each of said magnetoresistive elements having first and second terminating regions, said first magnetoresistive element first terminating region being connected to said third magnetoresistive element first terminating region, said first magnetoresistive second terminating region being connected to said second magnetoresistive element second terminating region, said third magnetoresistive element second terminating region being connected to said fourth magnetoresistive element second terminating region and said second magnetoresistive element first terminating region connected to said fourth magnetoresistive element first terminating region;

said first magnetic field sensing means and said second magnetic field sensing means each having an integral coil carrying a bias current, said current providing a magnetic field in a first direction and establishing an initial direction of magnetization in said first, second, third and fourth magnetoresistive elements in said first direction, means for supporting said said first magnetic field sensing means on a side of a conductor carrying a current to be measured and for supporting said second magnetic field sensing means on an opposite side of said conductor, with said first magnetic field sensing means and said second magnetic field sensing means lying in a common plane perpendicular to said conductor;

means for determining a combination of an output of said first magnetic field sensing means and an output of said second magnetic field sensing means with said combination being representative of said current to be measured, and;

said apparatus having a level of sensitivity to magnetic field components in a direction perpendicular to said first direction with said level of sensitivity being related to a level of said bias current.

11. The apparatus of claim 10 wherein said magnetoresistive elements have a herringbone shape.

12. The apparatus of claim 10 wherein said magnetoresistive elements comprise barber pole biasing.

13. The apparatus of claim 10 wherein said magnetic field sensing means comprises four meander type magnetoresistive elements forming four legs of a Wheatstone bridge with opposite legs of said Wheatstone bridge having current flow in the same direction.

14. The apparatus of claim 10 wherein said magnetic field sensing elements comprise elongated strips having a pattern of metal overlaid on said strips to alter the direction of current flow through said strips.

15. The apparatus of claim 10 wherein an output of said first magnetic field sensing means and an output of said second magnetic field sensing means are connected to provide an output representing a difference between said output of said first magnetic field sensing means and said output of said second magnetic field sensing means.

16. The apparatus of claim 15 wherein said means for determining said combination comprises processor means.

* * * * *